US006748338B2

(12) United States Patent
Cheng

(10) Patent No.: US 6,748,338 B2
(45) Date of Patent: Jun. 8, 2004

(54) METHOD AND APPARATUS FOR TESTING EYE DIAGRAM CHARACTERISTICS

(75) Inventor: Yi-Jen Cheng, Yunghu (TW)

(73) Assignee: Winbond Electronics Corporation, Hsinchu (TW)

(*) Notice: Subject to any disclaimer, the term of this patent is extended or adjusted under 35 U.S.C. 154(b) by 135 days.

(21) Appl. No.: 09/990,229

(22) Filed: Nov. 21, 2001

(65) Prior Publication Data

US 2003/0097231 A1 May 22, 2003

(51) Int. Cl.[7] .................................. G06F 19/00
(52) U.S. Cl. ......................................... 702/108
(58) Field of Search .................. 702/108; 324/627, 324/158, 11; 382/254, 260, 162, 236, 144; 342/158; 375/240, 341

(56) References Cited

U.S. PATENT DOCUMENTS

| | | | | |
|---|---|---|---|---|
| 4,268,861 A | * | 5/1981 | Schreiber et al. | 375/240.1 |
| 5,327,091 A | * | 7/1994 | Loughry | 324/627 |
| 5,533,066 A | * | 7/1996 | Yamaguchi et al. | 375/341 |
| 5,909,516 A | * | 6/1999 | Lubin | 382/260 |
| 6,137,904 A | * | 10/2000 | Lubin et al. | 382/162 |
| 6,522,776 B1 | * | 2/2003 | Ehrichs | 382/144 |
| 2002/0011835 A1 | * | 1/2002 | Yamazaki | 324/158.1 |

FOREIGN PATENT DOCUMENTS

EP          1143654        * 10/2001

* cited by examiner

Primary Examiner—John Barlow
Assistant Examiner—Tung S Lau
(74) Attorney, Agent, or Firm—Ladas & Parry

(57) ABSTRACT

The present invention discloses a method and apparatus for testing eye diagram characteristics. The present invention does not utilize a RF analyst used in prior art. On the contrary, the present invention directly sends a precondition from a mainframe to a chip under test, and the GLPF signals are read out from the chip under test. After digitalizing and normalizing the GLPF signals, an eye diagram program stored in the mainframe is executed and the eye diagram is reconstructed. Next, a software analyzer is used to compute an error between the eye diagram parameters and predefined specifications, to determine if the chip under test is in an allowable range of the specification according to the computed error. If the computed error is beyond the allowable range, the chip under test will be discarded.

6 Claims, 4 Drawing Sheets

METHOD AND APPARATUS FOR TESTING EYE DIAGRAM CHARACTERISTICS

BACKGROUND OF THE INVENTION

1. Field of the Invention

The present invention relates to a method and apparatus for testing a communication chip, and particularly to a method and apparatus for testing eye diagram characteristics of a communication chip.

2. Description of Related Art

For communication chips or system single chips, it is necessary to test the quality of eye diagram characteristics for the output signals of the Guassian Low Pass Filter (GLPF) of the transmitter before leaving the factory so as to pick out defective products. In the stage of research and engineering verification, engineers always use an oscilloscope or an RF analyst (such as HP 71501A) to check by hand if the eye diagram characteristics of the communication chips fit the requirement of specifications. However, in the stage of testing products, if the work is done by hand, it will slow down the output of products and increase the test cost.

FIG. 1 shows a prior art testing apparatus, including a mainframe 11, an RF analyst 15, a chip under test 14 and a mechanical arm 12. The chip under test 14 is placed on a testing plate 13 of the mechanical arm 12. First, the mainframe 11 issues a precondition to the chip under test 14, and drives the chip under test 14 output GLPF signals to the RF analyst 15. The RF analyst 15 transfers the GLPF signals into an eye diagram, and the workers check if the chip under test 14 fits specifications through a screen examination.

However, the above method cannot be made automatic so that a testing cycle of a chip will take a lot of time and lessen the output of products. Second, the RF analyst 15 is so expensive that the total testing cost is high. Third, due to man's neglects or an inaccurate comparison under an eyesight limitation, the defective chips cannot always be picked out by hand and errors are bound to happen.

To eliminate the disadvantages of the prior art, the present invention proposes a novelty method and apparatus for testing eye diagram characteristics to overcome the above drawbacks.

SUMMARY OF THE INVENTION

A main object of the present invention is to provide an automatic and a cost-down method and apparatus for testing eye diagram characteristics.

The second object of the present invention is to provide a method and apparatus for fast testing eye diagram characteristics.

To obtain the above purpose, the present invention does not utilize an RF analyst as used in prior art. On the contrary, the present invention directly sends a precondition from a mainframe to a chip under test, and the GLPF signals are read out from the chip under test. After digitalizing and normalizing the GLPF signals, an eye diagram program stored in the mainframe is executed and the eye diagram is reconstructed. Next, a software analyzer is used to compute an error between the eye diagram parameters and predefined specifications, and determining if the chip under test is in an allowable range of the specification according to the computed error. If the computed error is beyond the allowable range, the chip under test will be discarded.

BRIEF DESCRIPTION OF THE DRAWINGS

The present invention will be described according to the appended drawings in which.

PREFERRED EMBODIMENT OF THE PRESENT INVENTION

Figure 1:
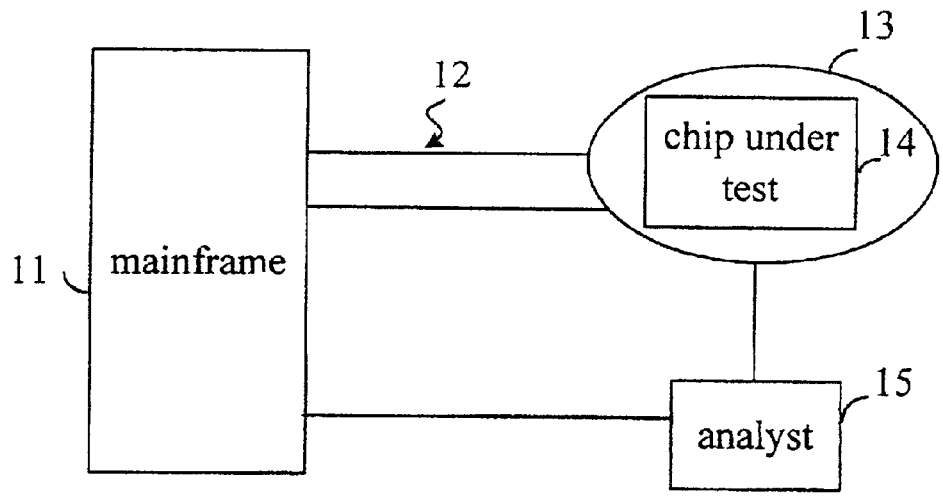
FIG. 1 shows a prior art testing apparatus.
Figure 2:
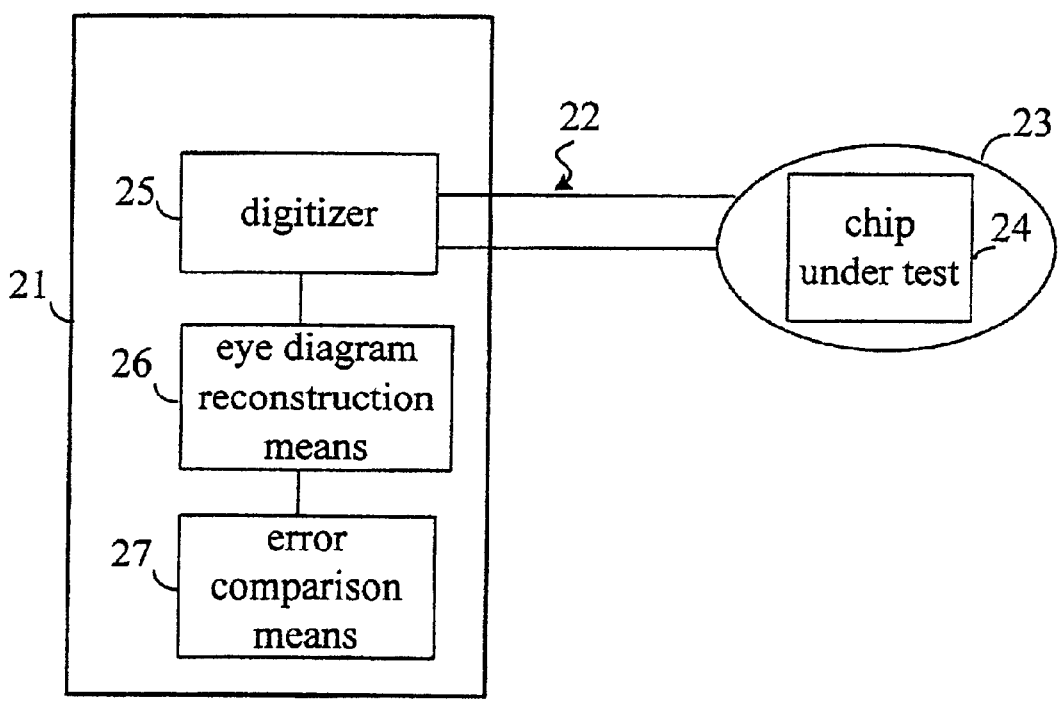
FIG. 2 shows an embodiment of a testing apparatus according to the present invention.

FIG. 2 shows an embodiment of a testing apparatus according to the present invention. The testing apparatus includes a mainframe 21, a chip under test 24 and a mechanical arm 22. The chip under test 24 is placed on a testing plate 23 of the mechanical arm 22. The characteristic of the present invention is that the mainframe 21 is an Automatic Testing Equipment (ATE), therefore inside of the mainframe 21 is a computing hardware (such as a workstation) which could be parameters and software programs inputted by users. Generally speaking, the mainframe 21 includes three modules a digitizer 25, an eye diagram reconstruction means 26 and an error comparison means 27. The digitizer 25 is used to capture GLPF output signals of the chip under test 24, and further digitizing and normalizing the GLPF output signals. The eye diagram reconstruction means 26 is used to overlap the captured signals in a cycle time to form an eye diagram. The error comparison means 27 is used to calculate if errors of parameters of the eye diagram are in an allowable range. If the answer is no, the defective product should be discarded.

Figure 3:
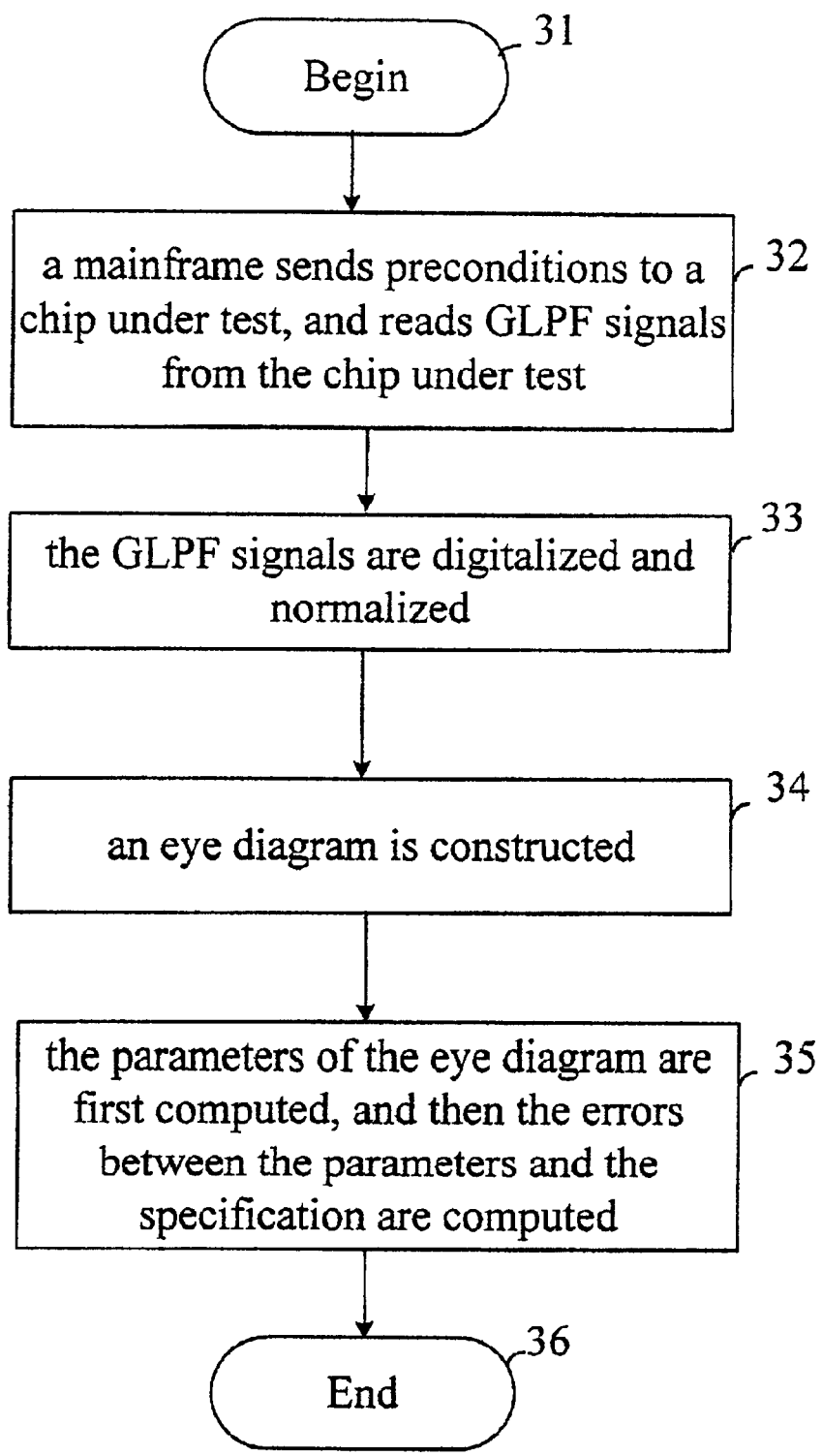
FIG. 3 shows a testing flow diagram of the present invention.

FIG. 3 shows a testing flow diagram of the present invention. In step 31, the present invention starts. In step 32, the mainframe 21 sends preconditions to the chip under test 24, and reads GLPF signals from the chip under test 24. Generally speaking, the present invention could capture signals from about thousands of test cycles according to a test period. In step 33, the GLPF signals are digitalized and normalized. In step 34, an eye diagram is constructed according to the steps shown in FIG. 4. In step 35, the parameters (such as a width, height, cross ratio, RMS-Jitter of the eye) of the eye diagram are first computed, and then the errors between the parameters and the specification are computed. The specification and a receptible error could be inputted by a tester, and the products should be discarded if their errors exceed the receptible error. In step 36, the present invention ends.

Figure 4:
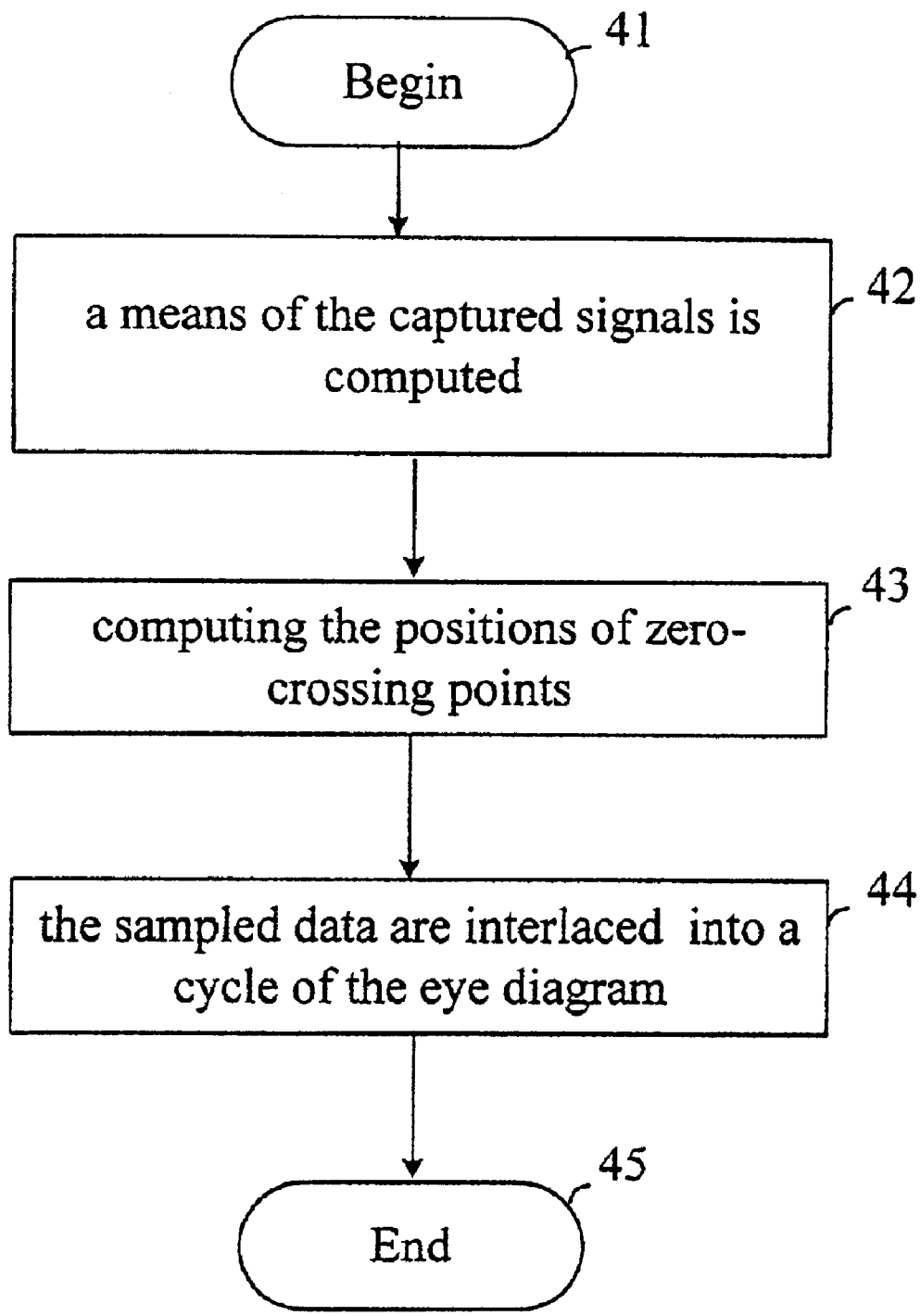
FIG. 4 shows a reconstruction flow of the eye diagram according to the present invention.
Figure 5:
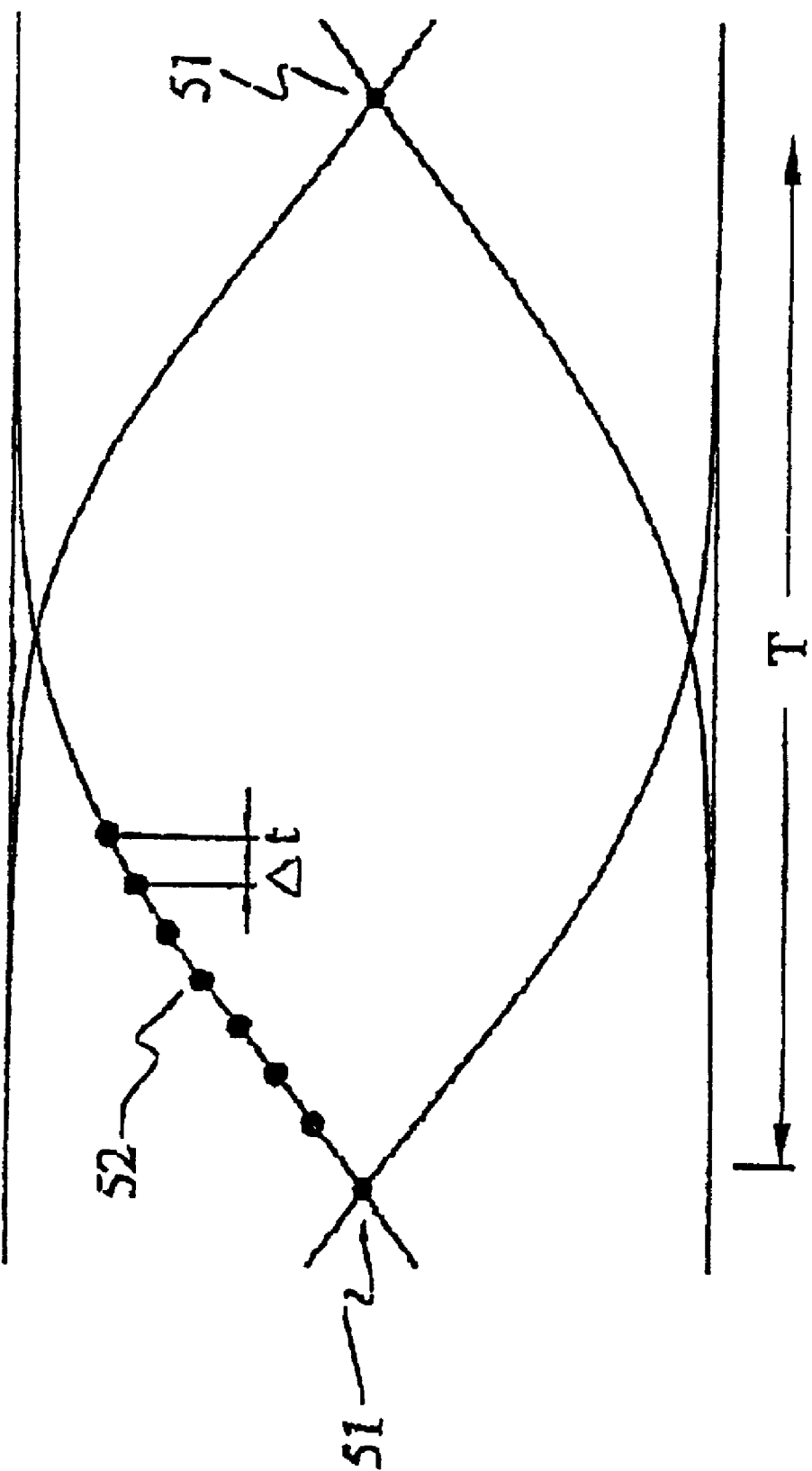
FIG. 5 shows a hint figure of an eye diagram.

FIG. 4 shows a reconstruction flow of the eye diagram according to the present invention, and FIG. 5 shows a hint diagram of an eye diagram. In step 41, the present invention starts. In step 42, a means of the captured signals 52 is computed. For example, the captured signals are first added together, and then averaged by their number. In step 43, the means is used to compute the positions of zero-crossing points (such as position 51 as shown in FIG. 5) acting as reference points. In step 44, a known data rate is used as an overlapping time T, and the sampled data are interlaced by a period $\Delta t$ (a reciprocal of the sampling frequency of the digitizer). By the above described, a series of sampled data can be overlapped into one cycle time so as to generate an eye diagram. In step 45, the present invention ends.

The above-described embodiments of the present invention are intended to be illustrative only. Numerous alternative embodiments may be devised by those skilled in the art without departing from the scope of the following claims.

What is claimed is:

1. A method for testing eye diagram characteristics, comprising the following steps:

sending a precondition from a mainframe to a chip under test, and reading resulting GLPF signals from the chip under test;

digitizing and normalizing the GLPF signals;

reconstructing an eye diagram according to the normalized GLPF signals;

analyzing an error between parameters of the eye diagram and a predefined specification; and deciding if the chip under test is valid according to the error analysis.

2. The method of claim 1, wherein the parameters of the eye diagram include a width of the eye diagram, a height of the eye diagram, a cross ratio of the eye diagram and a RMS-Jitter of the eye diagram.

3. The method of claim 1, wherein the step of reconstructing the eye diagram includes the following steps:

computing an average value of the normalized GLPF signals;

computing positions of zero-crossing points according to the average value; and utilizing a transmission rate of the GLPF signals as a cycle time of the eye diagram and overlapping a series of GLPF signals into a cycle period of the eye diagram.

4. An apparatus for testing eye diagram characteristics, comprising:

a mainframe, including:

(a) a digitizer for capturing GLPF signals of a chip under test, and digitalizing and normalizing the GLPF signals;

(b) an eye diagram reconstruction means for overlapping a series of GLPF signals into a cycle period of the eye diagram; and (c) an error comparison means for computing if parameter errors of the eye diagram are in an allowable range; and a mechanical arm connected to the mainframe for carrying the chip under test.

5. The apparatus of claim 4, wherein the mechanical arm includes a testing plate for carrying the chip under test.

6. The apparatus of claim 4, wherein the parameters of the eye diagram include a width of the eye diagram a height of the eye diagram, a cross ratio of the eye diagram and a RMS-Jitter of the eye diagram.

* * * * *